(12) United States Patent
Livshitz et al.

(10) Patent No.: US 9,233,858 B2
(45) Date of Patent: Jan. 12, 2016

(54) SYSTEM AND METHOD FOR TREATMENT OF LIQUID

(75) Inventors: Yuri Livshitz, Rishon Le-Zion (IL); Oren Gafri, Rishon Le-Zion (IL)

(73) Assignee: WADIS LTD., Herzlia (IL)

( * ) Notice: Subject to any disclaimer, the term of this patent is extended or adjusted under 35 U.S.C. 154(b) by 210 days.

(21) Appl. No.: 13/980,734

(22) PCT Filed: Jan. 19, 2012

(86) PCT No.: PCT/IL2012/050013
§ 371 (c)(1),
(2), (4) Date: Jul. 19, 2013

(87) PCT Pub. No.: WO2012/098549
PCT Pub. Date: Jul. 26, 2012

(65) Prior Publication Data
US 2013/0299351 A1 Nov. 14, 2013

(30) Foreign Application Priority Data

Jan. 23, 2011 (IL) .......................................... 210808
May 5, 2011 (IL) .......................................... 212693

(51) Int. Cl.
*C02F 1/46* (2006.01)
*H03K 3/53* (2006.01)
(Continued)

(52) U.S. Cl.
CPC ............ *C02F 1/4608* (2013.01); *B01J 19/087* (2013.01); *B01J 19/088* (2013.01);
(Continued)

(58) Field of Classification Search
CPC .................. C02F 1/4608; B01J 19/088; B01J 2219/0809; B01J 2219/0877; H03K 3/53; H03K 3/537; H03K 3/57
See application file for complete search history.

(56) References Cited

U.S. PATENT DOCUMENTS 3,366,564 A 1/1968 Allen
3,402,120 A 9/1968 Allen et al.
(Continued)

FOREIGN PATENT DOCUMENTS

CN 2832800 Y 11/2006
CN 201532229 U 7/2010
(Continued)

OTHER PUBLICATIONS

Shen et al, "Effect of Various Gases and Chemical Catalysts on Phenol Degradation Pathways by Pulsed Electric Discharges," Journal of Hazardous Materials, vol. 150, No. 3, Jan. 16, 2008, pp. 713-722 (See Fig. 2 and section 2.1 on p. 714).*
(Continued)

*Primary Examiner* — Keith Hendricks
*Assistant Examiner* — Salil Jain
(74) *Attorney, Agent, or Firm* — Browdy and Neimark, PLLC

(57) ABSTRACT

A system and method for treatment of a contaminated liquid is described. The system includes a high voltage supply device, a general capacitor bank, one or more general limiting member, such as general switch devices or general resister devices, coupled to the high voltage supply device and to the general capacitor bank. The system further includes one or more working capacitor banks coupled to the general capacitor bank through the general limiting member, and one or more working switches arranged in series with the corresponding working capacitor bank. The system also includes one or more potential electrodes and grounded electrodes immersed in the contaminated liquid and coupled to the working capacitor banks for providing an electric discharge through the contaminated liquid.

20 Claims, 4 Drawing Sheets

(51) Int. Cl.
*H03K 3/537* (2006.01)
*H03K 3/57* (2006.01)
*B01J 19/00* (2006.01)
*B01J 19/08* (2006.01)

(52) U.S. Cl.
CPC .. *B01J 2219/0809* (2013.01); *B01J 2219/0877* (2013.01); *H03K 3/53* (2013.01); *H03K 3/537* (2013.01); *H03K 3/57* (2013.01)

(56) References Cited

U.S. PATENT DOCUMENTS

| | | |
|---|---|---|
| 4,957,606 A | 9/1990 | Juvan |
| 5,397,961 A | 3/1995 | Ayers et al. |
| 6,093,432 A | 7/2000 | Mittal et al. |
| 6,327,163 B1 * | 12/2001 | Petr ................................ 363/124 |
| 8,110,155 B2 * | 2/2012 | Fridman et al. .......... 422/186.04 |
| 2006/0002050 A1 * | 1/2006 | Kichline, Jr. .................. 361/160 |

FOREIGN PATENT DOCUMENTS

| | | | | |
|---|---|---|---|---|
| EP | 2153851 A1 * | 2/2010 | ............... | H05H 1/24 |
| WO | WO 2010058401 A2 * | 5/2010 | ............... | H03K 3/53 |

OTHER PUBLICATIONS

International Search Report for Application No. OCT/IL2012/050013 dated Apr. 17, 2013.

Shen et al: "Effect of various gases and chemical catalysts on phenol degradation pathways by pulsed electrical discharges", Journal of Hazardous Materials, Elsevier, Amsterdam, NL, vol. 150, No. 3, Jan. 16, 2008, pp. 713-722.

\* cited by examiner

SYSTEM AND METHOD FOR TREATMENT OF LIQUID

CROSS REFERENCE TO RELATED APPLICATIONS

The present application is a national phase entry under 35 U.S.C. §371 of International Application No. PCT/IL2012/050013, filed Jan. 19, 2012 and published in English, which claims priority from IL 210808, filed Jan. 23, 2011, and IL 212693, filed May 5, 2011, the disclosures of which are incorporated herein by reference.

FIELD OF THE INVENTION

This invention relates to a technique for the treatment of contaminated liquid, and more particularly to a system and method for the treatment of water by using high-energy electrical discharge into a volume of the liquid.

BACKGROUND OF THE INVENTION

A significant amount of research and development has been undertaken in recent years towards environmental clean-up operations, and in particular to the purification and decontamination of groundwater, wastewater, and drinking water. A variety of techniques have been used in the prior art to destroy or remove contaminating and toxic materials such as trace organic and inorganic compounds; substances which produce color, taste and odor; pathogenic bacteria; and harmful suspended materials.

A technique is known in the art, usually under the name "electro-hydraulics", which utilizes high-energy electrical discharge into a volume of liquid for the purpose of disinfecting water, changing chemical constituents and recovering metals and other substances from liquids or slurries (see, for example, U.S. Pat. No. 3,366,564 to Allen; U.S. Pat. No. 3,402,120 to Allen et al.; and U.S. Pat. No. 4,957,606 to Juvan). According to this technique, an electro-hydraulic shock wave within the liquid, intensive light radiation and thermo-chemical reactions are initiated by arc discharge into a spark gap formed by the electrodes immersed in the liquid.

FIG. 1 shows an electric scheme of a typical prior art system 10 for treatment of contaminated liquid by utilizing high-energy electrical discharge. The system 10 includes a high-voltage supply device 11 having a rectifier (not shown) coupled to a high voltage capacitor bank 12 that comprises one or more capacitors. The coupling of high-voltage supply device 11 to the capacitor bank 12 can, for example, be a direct "galvanic" connection. Alternatively, as is explained below, the connection can be through a resistive element and/or a switching element. The supply device 11 and the high voltage capacitor bank 12 form together a charge circuit A.

The system 10 also includes a high current switch 13 in series with the capacitor bank 12 and a pair of electrodes 14a and 14b separated by a gap in series with high current switch 13. In operation, the electrodes 14a and 14b are in contact with a liquid 15 for providing an electric discharge in the gap therebetween within the liquid. The capacitor bank 12, together with the high current switch 13, the electrodes 14a and 14b, and all interconnection cables therebetween form a discharge circuit B. For safety reasons, one of the terminals of the high-voltage supply device 11 (for example, which is connected to the electrode 14b) is permanently grounded. For example, only one of the electrodes (14a in FIG. 1) can be immersed in the liquid 15 under treatment, whereas the second electrode (14b in FIG. 1) can be coupled to or associated with a conductive body of the treatment vessel 16 holding the liquid 15. When desired, both electrodes can be immersed in the liquid 15 under treatment.

In operation, the capacitor bank 12 is charged by the voltage supply device 11. During the charging of the capacitor bank 12, the high current switch 13 is open. After the charging, the capacitor bank 12 can be discharged by closing the switch 13, in order to supply a high voltage to the electrodes 14a and 14b, and thereby generate an electric current pulse therebetween through the liquid under treatment. The closing of the high current switch 13 is usually activated by an ignition circuit (not shown) launching an ignition electric pulse to the switch 13.

Despite the apparent simplicity, the system 10 suffers from a number of limitations. In particular, the current charging the capacitor bank 12 has a form of an attenuated exponent. Accordingly, the charging current is large only at the very beginning of the charging process, and then the charging current becomes smaller over time. As a result, the power supply efficiency is low.

Another drawback is associated with the transient current behavior in the discharge circuit B. Since the discharge circuit B represents a series RLC circuit, the transient response of the circuit B depends on the damping factor $\zeta$ that is given by $$\zeta = \frac{R}{2}\sqrt{\frac{C}{L}}$$

where C is the capacitance (in Farads) of the capacitor bank 12, L is the inductance (in Henrys) and R is the resistance (in Ohms) of the discharge circuit B.

The current behavior i(t) during a transient response for different $\zeta$ is shown in FIG. 2. As can be seen, this behavior depends on the value of $\zeta$. In particular, when $0<\zeta<1$ (the under-damped response, curves 21-23), the transient current decays with oscillation. On the other hand, the transient current decays without oscillations occur when the $\zeta \geq 1$ (the critically damped, curves 24; and over-damped response, curves 25-25).

In the case of oscillating current decays, the negative reverse components $I_R$ of the oscillating transient current i(t) produce a reverse voltage of high amplitude across the capacitor bank 12. As a result, the corresponding reverse discharge current can pass through the high-voltage supply device 11, thereby damaging it.

In order to decrease the reverse current of the electric discharge through the high-voltage supply device 11, a current limiting resistor 17 is usually included into this chain between the capacitor bank 12 and the voltage supply device 11 for limiting the discharge current. Although this provision enables protection of the voltage supply device 11 from damage, it results in electric losses and extra expenses.

SUMMARY OF THE INVENTION

There is still a need in the art for, and it would be useful to have, a novel system for treatment of contaminated liquid. The apparatus should be sufficiently reliable and efficient for decontamination of groundwater, wastewater, and drinking water to destroy or remove contaminating and toxic materials such as trace organic and inorganic compounds; substances which produce color, taste and odor; pathogenic bacteria; and harmful suspended materials. The liquid under treatment can be either a still liquid placed in the vessel or a running liquid.

The present invention partially eliminates disadvantages of the conventional techniques and provides a new system for treatment of a contaminated liquid.

The system includes a high voltage supply device, a general capacitor bank, one or more general limiting member, such as general switch devices or general resister devices, coupled to the high voltage supply device and to the general capacitor bank. The system further includes one or more working capacitor banks coupled to the general capacitor bank through the general limiting member, and one or more working switches arranged in series with the corresponding working capacitor bank. The system also includes one or more potential electrodes and grounded electrodes immersed in the contaminated liquid and coupled to the working capacitor banks for providing an electric discharge through the contaminated liquid.

According to an embodiment of the invention, an electrical capacity of the general capacitor bank is greater than the electrical capacity of the working capacitor banks.

According to an embodiment of the invention, any desired number of the working capacitor banks can be used. Any two neighboring working capacitor banks can be separated from each other by a working current resistive element. For example, the working current resistive element can be arranged in a potential electric line and coupled to the potential terminal of the high-voltage supply device. Alternatively, the current resistive element can be arranged in a grounded electric line.

According to an embodiment of the invention, the general limiting member is arranged in the potential electric line and coupled to the potential terminal of the high-voltage supply device.

According to another embodiment of the invention, the general limiting member is arranged in the grounded electric line and coupled to the grounded terminal of the high-voltage supply device.

According to an embodiment of the invention, the grounded electrode is associated with a grounded conductive body of a treatment vessel holding the liquid.

According to an embodiment of the invention, ground terminals of the general capacitor bank and said at least one working capacitor bank are connected together by a common grounded bus coupled to the grounded terminal of the high-voltage supply device.

According to an embodiment of the invention, the system includes one general limiting resister arranged in the potential electric line and another general limiting resister arranged in the grounded electric line.

According to one embodiment of the invention, the general limiting member(s) and the working switch(es) are high current switches. Such high current switches can, for example, be three electrode spark-gap switches including two switching electrodes forming the switching paths and a trigger electrode configured for providing passage of high current between the two switching electrodes.

According to another embodiment of the invention, the working switches are semiconductor high current switches.

According to a still another embodiment of the invention, the system further comprises an additional general switch connected to the general capacitor bank, one or more additional working capacitor banks having a grounded terminal and a potential terminal coupled to the general capacitor bank through the additional general switch. In this embodiment, the system also has one or more additional working switches arranged in series with and between the potential terminal of the corresponding additional working capacitor banks and the corresponding electrodes that are immersed into the liquid under treatment.

According to an embodiment of the invention, the additional working capacitor banks are separated from each other by an additional current resistive element arranged in the potential power line.

According to an embodiment of the invention, an additional electrical capacity $C_{add}$ of the additional capacitor bank is greater than an electrical capacitance $C_w$ of the working capacitor bank, but it is less than a capacitance $C_g$ of the general capacitor bank.

According to one embodiment of the invention, all the working capacitor banks have the same value of electric capacitance.

According to another embodiment of the invention, all the electric capacitance values of the working capacitor banks have different values.

The system according to the present invention may be easily and efficiently fabricated and marketed.

The system according to the present invention is of durable and reliable construction.

The system according to the present invention may have a low manufacturing cost.

According to another aspect of the present invention, there is provided a method for treatment of a contaminated liquid. According to the embodiment with general limiting member in the form of a switch device, the method starts placing the general limiting member and the working switches in the switched off position. The method includes charging the general capacitor bank by connecting to the voltage supply device, switching on the general limiting member to supply a high voltage to the working capacitor bank(s) for charging thereof by partially discharging the general capacitor bank, and switching on the working switches, thereby discharging the working capacitor bank(s) and generating a transient electric current pulse between the potential electrode(s) and the grounded electrode(s).

According to one embodiment of the invention, the method comprises the step of simultaneous switching on the working switches to provide a simultaneous electric discharge of the working capacitor banks through the contaminated liquid between the potential electrodes and the grounded electrodes.

According to one embodiment of the invention, the method comprises switching on the working switches in accordance with a predetermined algorithm.

According to still a further embodiment of the invention, the method comprises the step of switching off the general limiting member to break the connection between the general capacitor bank and the working capacitor banks before the step of switching on the working switches.

According to a further embodiment of the invention, the method further comprises switching on the additional general switch to supply a high voltage to the additional working capacitor banks for charging thereof by further partial discharging the general capacitor bank, and switching on the additional working switches to provide discharge of the additional working capacitor banks and thereby to maintain transient electric current between the corresponding potential electrode and the grounded electrode.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, preferred embodiments will now be described, by way of non-limiting example only, with reference to the accompanying drawings, in which.

DETAILED DESCRIPTION OF EMBODIMENTS

Figure 1:
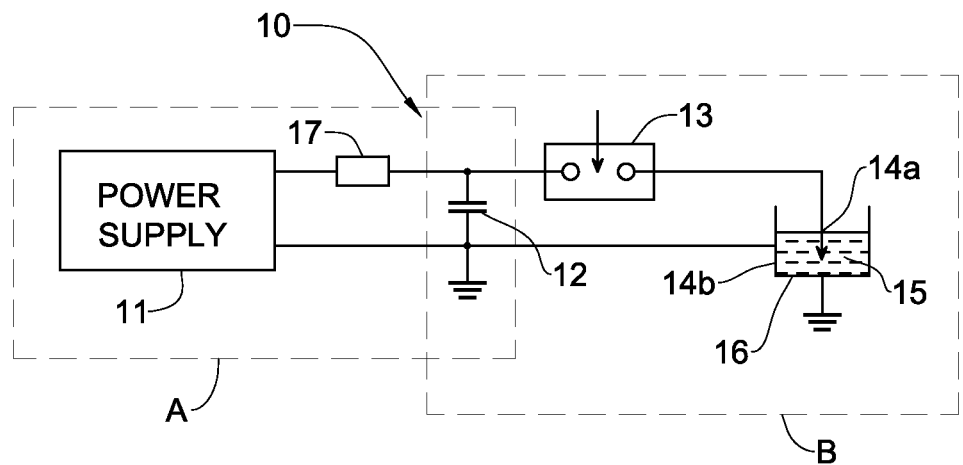
FIG. 1 is an electric scheme of an exemplary prior art system for treatment of contaminated liquid.

The principles and operation of the system for treatment of contaminated liquid according to the present invention may be better understood with reference to the drawings and the accompanying description, wherein like reference numerals have been used throughout to designate identical or equivalent elements, where it is convenient for description. It should be understood that these drawings, which are not necessarily to scale, are given for illustrative purposes only, and are not intended to limit the scope of the invention. Examples of constructions are provided for selected elements. Those versed in the art should appreciate that many of the examples provided have suitable alternatives which may be utilized.

Figure 2:
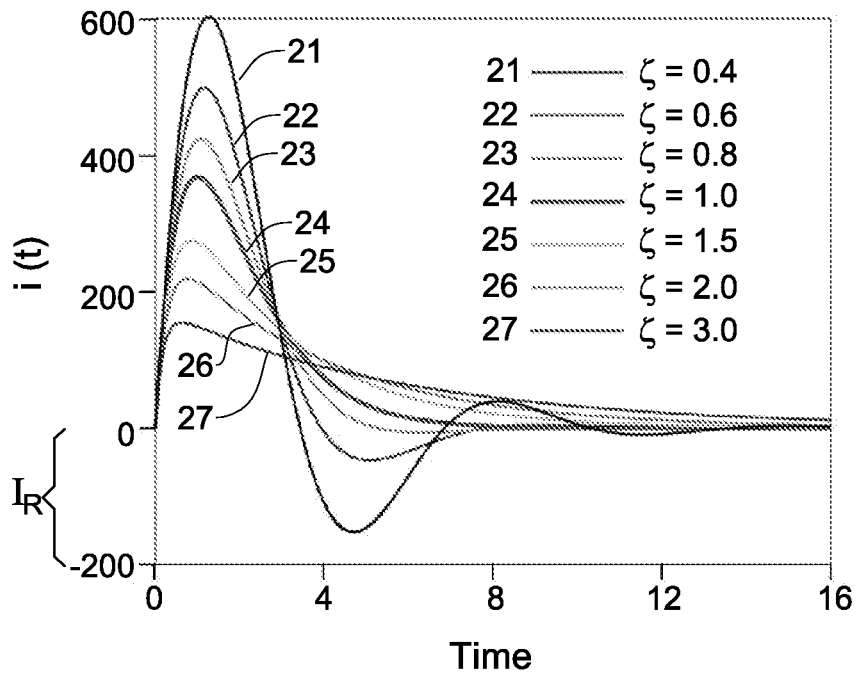
FIG. 2 is a transient current behavior of a series RLC circuit for different values of the damping factor.

The electric scheme of the prior art system 10 for treatment of contaminated liquid shown in FIG. 1 and the current behavior shown in FIG. 2 have already been described in the background section, so further detailed discussion of this electric scheme is considered unnecessary here.

Figure 3A:
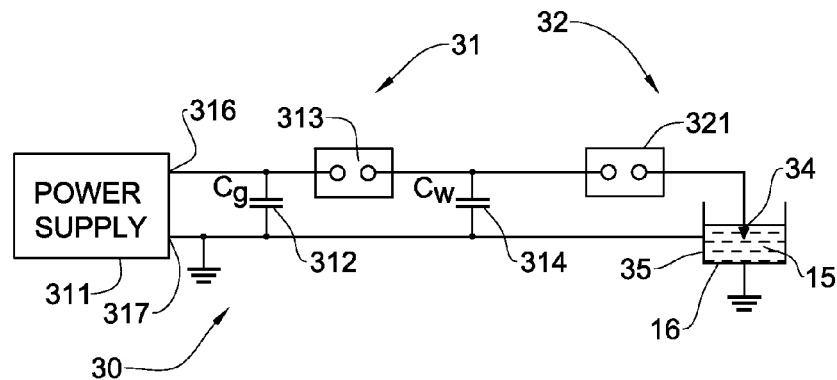
FIGS. 3A and 3B are electric schemes of a system for treatment of contaminated liquid, according to two embodiments of the present invention.
Figure 3B:
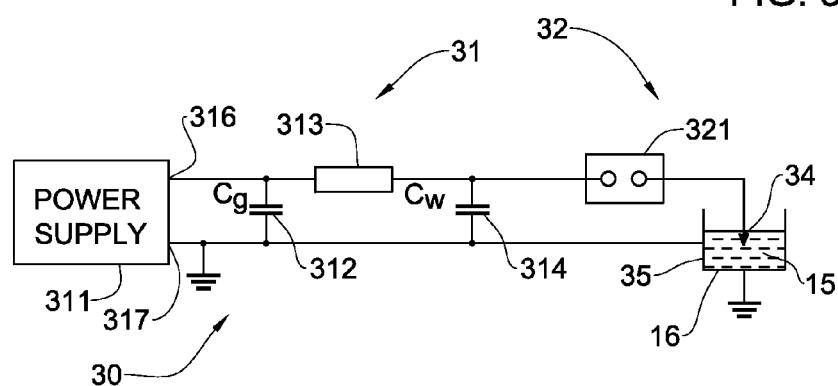

Referring to FIGS. 3A and 3B together, an electric scheme of a system 30 for treatment of a contaminated liquid is shown, according to two embodiments of the invention. The system 30 includes a charge circuit 31 and a discharge circuit 32. The charge circuit 31 includes a high-voltage supply device 311 having a rectifier (not shown) connected to a general capacitor bank 312. The charge circuit 31 also includes a working capacitor bank 314 coupled to the general capacitor bank 312 through a general limiting member 313. According to the embodiment shown in FIG. 3A, the general limiting member 313 is a switch device, which is referred to as a general switch, whereas according to the embodiment shown in FIG. 3B, the general limiting member 313 is a resister device, which is referred to as a general limiting resister.

The general capacitor bank 312 and the working capacitor bank 314 are high voltage capacitor banks that may comprise one or more capacitors. According to an embodiment of the present invention, an electrical capacity $C_g$ of the general capacitor bank 312 is significantly greater than the electrical capacity $C_w$ of the working capacitor bank 314. For example, $C_g$ can be greater than $10\ C_w$, and more preferable can be greater than $20\ C_w$.

As shown in FIGS. 3A and 3B, the general limiting member 313 is arranged in the potential electric line and is coupled to a potential terminal 316 of the high-voltage supply device 311. However, when desired, the general limiting member 313 can be arranged in the grounded line between the general capacitor bank 312 and the working capacitor bank 314, and be coupled to a grounded terminal 317 of the high-voltage supply device 311. Moreover, when desired, the system 30 for treatment of a contaminated liquid can include two general limiting members between the general capacitor bank 312 and the working capacitor bank 314 such that one general limiting member 313 is arranged in the potential electric line and other general limiting resister (not shown) is arranged in the grounded line.

The discharge circuit 32 of the system 30 includes a working switch 321 in series with the working capacitor bank 312 and a pair of electrodes 34a and 34b separated by a gap in series with the working switch 321 for providing an electric discharge between the electrodes 34a and 34b within the gap in the liquid under treatment. As shown in FIGS. 3A and 3B, the electrode 34a is coupled to the potential terminal 316 that is terminated by a working end (indicated by arrow) immersed into a liquid 15, whereas the second electrode 34b is coupled to or associated with a grounded conductive body of the treatment vessel 16 holding the liquid 15. It should be understood that when desired, the potential electrode 34a can be terminated by a plurality of working ends distributed within a desired volume of the liquid 15 and connected via cables to the common electrode 34a, thereby extending the treated area.

For safety reasons, one of the terminals of the high-voltage supply device 311 (for example, which is connected to the conductive body of the treatment vessel 16) is permanently grounded. The term "vessel" is broadly used to describe any container, tank, chamber, cartridge, surrounding housing, frame assembly or any other structure that has a conductive body which can be used for holding the contaminated liquid during the treatment in accordance with the teaching of the present invention.

The liquid under treatment can be either a still liquid placed in the vessel or a running liquid. In the case of a running liquid, the ends of the potential electrode and the grounded electrode can be both immersed in the liquid.

The general switch (the element 313 in FIG. 3A) and the working switch 321 are high current switches. For example, each high current switch is a three electrode spark-gap switch including two switching electrodes forming the switching paths and a third electrode (trigger electrode) configured for providing passage of high current between the two switching electrodes. Examples of the high current switches include, but are not limited to, a vacuum switch, a spark gap switch filled with a gas (trigatron), an ignitron, a thyratron, etc. The system 30 also includes corresponding ignition units (not shown) configured for closing the high current switches 313 and 321 by launching ignition high voltage electric pulses to the trigger electrodes. It should be noted that when desired, the high current switch 321 can be a semiconductor high current switch or a vacuum switch. The operation of spark-gap switch devices, semiconductor high current switches and vacuum switches is known per se, and therefore will not be expounded hereinbelow.

The operation of the system 30 starts from charging the general capacitor bank 312 by the voltage supply device 311. During this charging, the working switch 321 is in the switched off position. When the general limiting member 313 is the general switch 313 then it is also in the switched off position. In operation, the general capacitor bank 312 is permanently charged since it is permanently connected to the voltage supply device 311.

According to the embodiment shown in FIG. 3A, the general capacitor bank 312 can be partially discharged by closing (switching on) the general switch 313, to supply a high voltage to the working capacitor bank 314. According to the embodiment shown in FIG. 3B, the general capacitor bank 312 is also partially discharged to supply a high voltage to the working capacitor bank 314 through the general limiting resister 313.

The decrease of voltage across the general capacitor bank 312 owing to this discharge can be estimated by $(C_g-C_w)/C_g$. Due to the condition $C_g \gg C_w$, this loss is relatively small, i.e., $(C_g-C_w)/C_g \ll 1$. Thus, the drop of the voltage across the general capacitor bank 312 can be easily compensated by charging the general capacitor bank from the voltage supply device 311.

According to the embodiment shown in FIG. 3A, as soon as the charging process of the working capacitor bank 314 is complete, the general switch 313 should be switched off in order to break the connection between the general capacitor bank 312 and the working capacitor bank 314, and thereby to avoid a further discharge of the general capacitor bank 312 together with the working capacitor bank 314. In the case of the embodiment shown in FIG. 3B, the general limiting resister 313 limits the current between the general capacitor bank 312 and the working capacitor bank 314, thereby avoiding the discharge of the general capacitor bank 312 together with the working capacitor bank 314. Closing the working switch 321 results in discharge of the working capacitor bank 314 and generation of a transient electric current pulse between the electrodes 34a and 34b through the liquid under treatment.

When the parameters of the discharge circuit 32 are such that the transient current decays with oscillation, a reverse voltage $U_w^{(-)}$ corresponding to the negative reverse components of the oscillating transient current can sometimes occur not only across the voltage supply device 311 but also across the general capacitor bank 312, if it is coupled in parallel to the voltage supply device 311 at this moment. The corresponding negative electric charge $Q_w^{(-)}=C_w U_w^{(-)}$ associated with the oscillating transient current has a magnitude that is significantly less than the positive electric charge $Q_g^{(+)}=C_g U_{PS}^{(+)}$ stored in the general capacitor bank 312. Therefore, the total electric charge across the general capacitor bank 312 will have a positive magnitude, thereby preventing passage of a damaging negative reverse component of the oscillating transient current through the voltage supply device 311.

For example, typical values for the components of the system 30 and the parameters of its operation are as follows. The nominal voltage provided by the high-voltage supply device 311 can be in the range of 20 kV-40 kV, the capacitance $C_g$ of the general capacitor bank 312 can be in the range of 4-5 microfarads, and the capacitance $C_w$ of the working capacitor bank 314 can be in the range of 0.1 microfarads-0.2 microfarads. The electrical resistance of the general limiting resister 313 can be in the range of 10 kOhm-50 kOhm.

For example, an energy required for a disinfection of a certain volume of liquid is in the range of up to 10 J (Joules). For this case, for example, a working capacitance $C_w$ can be 0.01 µF (microfarad), the general capacitance $C_g$ can be 10 µF, and a working voltage can be 30 kV. Accordingly, in the working capacitor bank 314, the energy stored is $W=C_w U^2/2=4.5$ J, and the electric charge is $Q_w=C_w U=3\cdot 10^{-4}$ Q (Coulombs); whereas, in the general capacitor bank 312, the energy stored is 450 J, and the electric charge is 0.3 Q. As can be understood, in this case, the variation of the voltage owing to the reverse component of the oscillating transient current that can be estimated as $Q_w/C_g=30$V. Accordingly, the voltage variation does not exceed 1%.

Figure 4A:
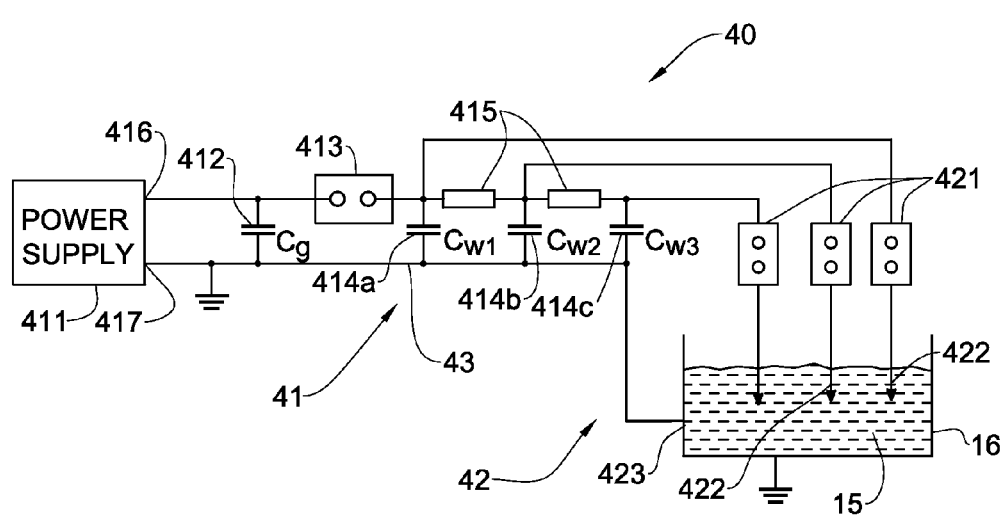
FIGS. 4A and 4B are electric schemes of two alternative embodiments of the system of the present invention.
Figure 4B:
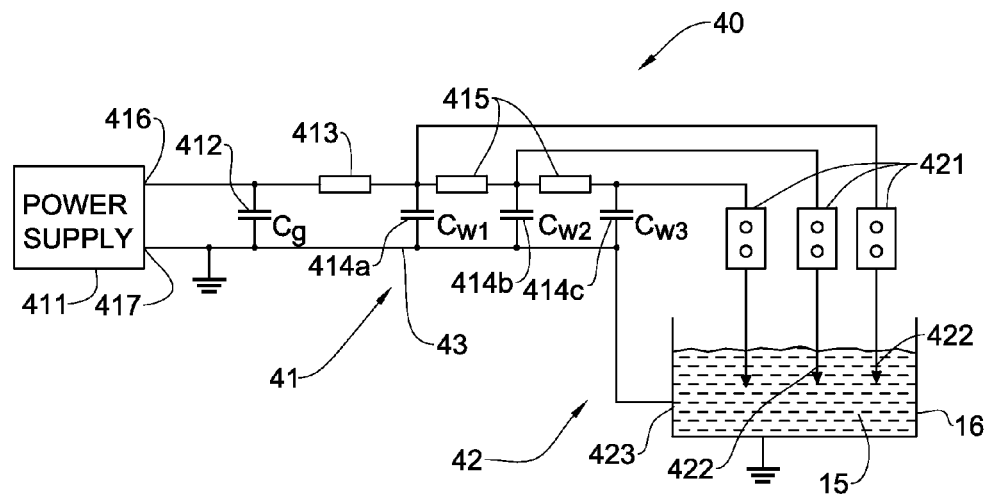

Referring to FIGS. 4A and 4B together, an electric scheme of a system 40 for treatment of a contaminated liquid is shown, according to two another embodiments of the invention. The system 40 includes a charge circuit 41 and a plurality of equivalent discharge modules 42 electrically coupled to charge circuit 41. For the purpose of simplicity of illustration, only three discharge modules 42 are shown in FIGS. 4A and 4B, however, any desired number of the discharge modules 42 can be used.

The charge circuit 41 includes a high-voltage supply device 411 connected to a general capacitor bank 412 of the charge circuit 41 and a plurality of working capacitor banks. Each discharge modules 42 includes a corresponding working capacitor bank. Three working capacitor banks are shown in FIGS. 4A and 4B which are indicated by reference numerals 414a, 414b and 414. The working capacitor banks 414a-414c are separated from each other by corresponding working current resistive elements 415.

The general capacitor bank 412 is coupled to the working capacitor bank 414a through a general limiting member 413. It should be understood that generally the general capacitor bank 412 can be coupled to any one of the working capacitor banks 414a-414c. The purpose of the general limiting member 413 is to limit the current between the general capacitor bank 412 and the working capacitor bank 414a for avoiding a discharge of the general capacitor bank 412 together with the working capacitor bank 414a.

As shown in FIGS. 4A and 4B, the general limiting member 413 is arranged in the potential electric line and is coupled to a potential terminal 416 of the high-voltage supply device 411. However, when desired, the general limiting member 413 can be arranged in the grounded line between the general capacitor bank 412 and any one of the working capacitor banks 414a-414c, and be coupled to a grounded terminal 417 of the high-voltage supply device 411. It should be understood that when desired, in addition to the general limiting member 413 arranged in the potential electric line, another general limiting member (not shown) can also be arranged in the grounded line between the general capacitor bank 412 and any one of the working capacitor banks 414a-414c for avoiding a discharge of the general capacitor bank 412 together with the working capacitor bank 414a.

According to the embodiment shown in FIG. 4A, the general limiting member 413 is a switch device, which is referred to as a general switch, whereas according to the embodiment shown in FIG. 4B, the general limiting member 413 is a resister device, which is referred to as a general limiting resister.

The purpose of the working current resistive elements 415 is to separate the discharge modules 42 from each other as will be described hereinbelow. As shown in FIGS. 4A and 4B, the working current resistive elements 415 are all arranged in the potential electric line and is coupled to the potential terminal 416 of the high-voltage supply device 411 in series through the general limiting member 413. However, when desired, corresponding current resistive elements can be arranged in series between the working capacitor banks 414a-414c in the grounded line. In this case (not illustrated in FIGS. 4A and 4B), the working current resistive elements 415 can be coupled to a grounded terminal 417 of the high-voltage supply device 411.

Each discharge module 42 comprises a working switch 421 in series with the corresponding working capacitor bank (414a, 414b or 414c) and a corresponding potential electrode 422 arranged in series with the corresponding working switch 421. The potential electrode 422 is separated by a gap with a ground electrode 423. In operation, the electrodes 422 and 423 should be immersed into a liquid 15 and distributed over a desired volume under treatment for providing an electric discharge within the gap. As shown in FIGS. 4A and 4B, only the electrodes 422 of all the discharge modules 42 are terminated by working ends (indicated by arrows) immersed and distributed into the liquid 15 under treatment, whereas the second electrodes 423 of all the discharge modules 42 are all connected together and coupled to or associated with the grounded conductive body of the treatment vessel 16 holding the liquid 15.

For safety reasons, one of the terminals of the high-voltage supply device 411 (preferably, the terminal 417 which is connected to the treatment vessel 16) is permanently grounded. According to an embodiment of the present invention, all the ground terminals of the general capacitor bank 412 and the working capacitor banks 414a, 414b or 414c can be connected together by a common grounded bus 43 coupled to the grounded terminal 417 of the high-voltage supply device 411. Preferably, the grounded bus 43 is implemented on the basis of a conductive bus-bar. Examples of materials suitable for the common conductive bus-bar include, but are not limited to, copper and aluminum.

The operation of the system 40 is similar to the operation of the system 30, mutatis mutandis, and it starts from charging the general capacitor bank 412 by the voltage supply device 411. The working switches 421 (and the general switch 413 in the case of the embodiment shown in FIG. 4A) are all in the switched off position. In operation, the general capacitor bank 412 is permanently charged since it is permanently connected to the voltage supply device 411.

According to the embodiment shown in FIG. 4A, the general capacitor bank 412 can be partially discharged by switching on the general switch 413, to supply a high voltage to the working capacitor banks 414a-414c. As soon as the charging process of the working capacitor banks 414 is complete, the general switch 413 should be switched off in order to break the connection between the general capacitor bank 412 and the working capacitor banks 414a-414c, and thereby to avoid a further discharge of the general capacitor bank 412 together with the working capacitor bank 414a-414c.

According to the embodiment shown in FIG. 4B, during charging the general capacitor bank 412 by the voltage supply device 411, the working switches 421 should all be in the switched off position. In operation, the general capacitor bank 412 is permanently charged since it is permanently connected to the voltage supply device 411. The general capacitor bank 412 is permanently discharged through the general limiting resister (413 in FIG. 4A), to supply a high voltage to the working capacitor banks 414a-414c. The general limiting resister (413 in FIG. 4B) limits the current between the general capacitor bank 412 and the working capacitor banks 414a-414c, and thereby prevents discharge of the general capacitor bank 412 together with the working capacitor banks 414a-414c.

Closing one or more working switches 421 results in discharge of the corresponding working capacitor banks 414a-414c and in generation of a transient electric current pulse between the electrodes 422 and 423 through the liquid 15 under treatment.

According to one embodiment, all the high current switches 421 can, for example, be vacuum switches (ignitrons) which are activated by a common ignition circuit (not shown), so as to provide substantially simultaneous ignition thereof. However, it was found that in practice the working switches 421 cannot operate simultaneously. Thus, even a miserable ignition advance of one of the switches can lead to a voltage drop on the working capacitor bank 414a-414c, such that ignition of the rest of the switches will be prevented.

In order to exclude such a possibility, the present embodiment teaches to couple each working capacitor bank to its neighboring working capacitor bank through the current resistive elements 415. As shown in FIGS. 4A and 4B, the working capacitor bank 414a is coupled to the working capacitor bank 414b through one of the current resistive elements 415, which, in turn, is coupled to the working capacitor bank 414c through another current resistive element 415.

Let us consider a case when one of the working switches 421 comes in action ahead of the other switches. The variations of the voltage U over time t across the working capacitor banks 414a-414c in the discharge modules 42 in which the switches were not yet activated can be estimated by $$U = U_{max} \exp(-t/RC),$$

where $U_{max}$ is the maximal voltage, R is the electrical resistance of the resistive elements 415 and C is the capacitance of each working capacitor bank 414. According to an embodiment of the present invention, the magnitude of the electrical resistance R is such that the ignition delay τ between the working switches 421 would be less than or equal to the relaxation time RC of the working capacitor bank (414a, 414b or 414c), to wit: τ≤RC. For example, in practice, the ignition delay can be in the range of several microseconds. Such a provision can prevent a too sharp voltage decrease across the working capacitor banks 414a-414c, and thus enables the concurrent operation of all the working switches 421. An additional functionality of this separation is to direct all the discharge currents of each capacitor bank through its respective switch, thus to prevent switch overloading.

For example, typical values for the components of the system 40 and the parameters of its operation are as follows. The number of the discharge modules 42 can, for example, be the range of 3-5, the nominal voltage provided by the high-voltage supply device is 30 kV, the electrical resistance of the resistive elements 415 is the range of 1 kOhm-10 kOhm, the capacitance $C_g$ of the general capacitor bank 412 is the range of 4-5 microfarads, and the capacitance $C_w$ of the working capacitor bank (414a, 414b or 414c) is the range of 0.1 microfarads-0.2 microfarads. The electrical resistance of the general limiting resister (413 in FIG. 4B) can, for example, be in the range of 10 kOhm-50 kOhm.

According to another embodiment, each high current switch 421 can be activated by a plurality of dedicated ignition circuits (not shown), so as to provide a desired sequence of activation of the current switches 421, in accordance with a predetermined algorithm.

When desired, all the working capacitor banks 414a-414c can have the same value of electric capacitance. Alternatively, the electric capacitance values $C_{w(414a)}$, $C_{w(414b)}$ or $C_{w(414c)}$ of the working capacitor banks 414a-414c, correspondingly, may be different.

Figure 5:
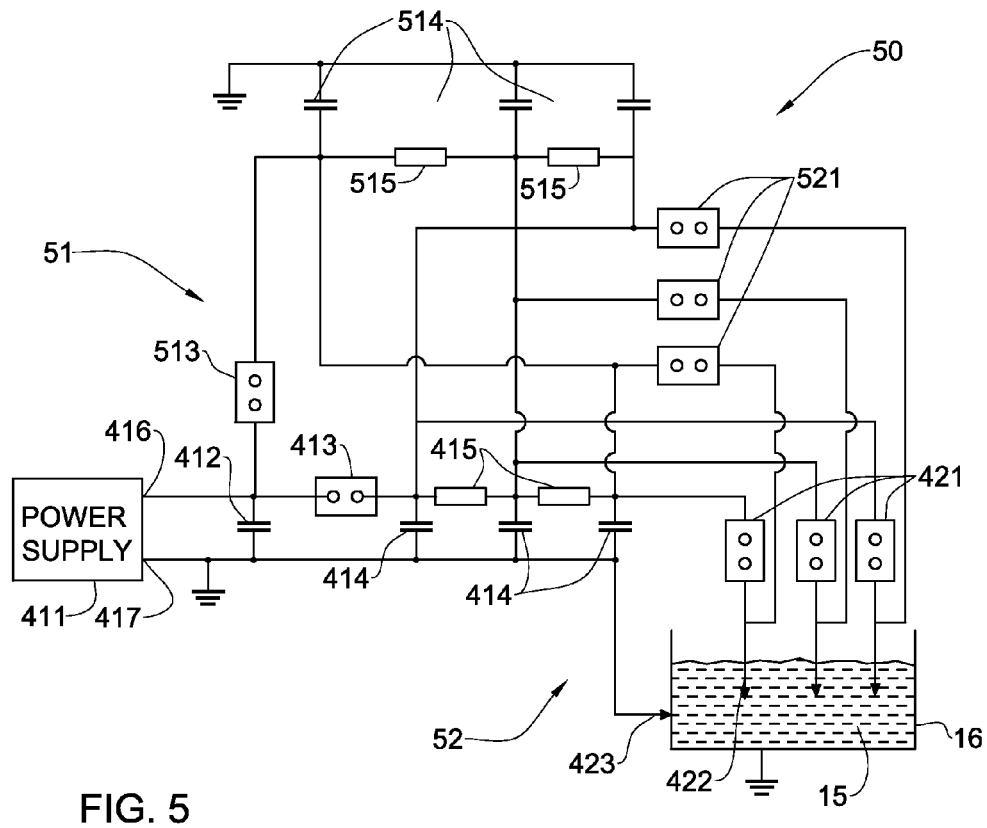
FIG. 5 is an electric scheme of a system for producing a strong electric pulse, according to a further embodiment of the present invention.

Referring to FIG. 5, an electric scheme of a system 50 for treatment of a contaminated liquid is shown, according to a further embodiment of the invention. The system 50 includes a charge circuit 51 and a plurality of equivalent discharge modules 52 electrically coupled to charge circuit 51. The system 50 differs from the system (40 in FIG. 4A) in the fact that it further includes a plurality of additional working capacitor banks 514 coupled at one terminal to the general capacitor bank 412 through an additional general member, such as an additional general switch 513 connected to the potential terminal 416 of the high-voltage supply device 311.

The additional working capacitor banks 514 are separated from each other by additional current resistive elements 515 arranged in the potential power line. The other terminal of the additional working capacitor banks 514 is grounded.

The system 50 also comprises a plurality of additional working switches 521 in series with the potential terminal of the corresponding additional working capacitor bank 514 that is coupled to the corresponding electrode 422 immersed into the liquid 15.

According to an embodiment of the invention, an additional electrical capacity $C_{add}$ of the additional capacitor bank 514 is greater than an electrical capacitance $C_w$ of the working capacitor bank 414, but it is less than an electrical capacitance $C_g$ of the general capacitor bank 412, i.e., $C_w < C_{add} << C_g$. For example, the capacitance $C_g$ of the general capacitor bank can be in the range of 10 µF-50 µF (microfarad), the capacitance $C_w$ of the working capacitor bank 414 can be in the range of 0.01 µF-0.05 µF, and the capacitance $C_{add}$ of the additional working capacitor bank 514 can be in the range of 1 µF-5 µF.

It should be noted that the system 50 is practically most useful in cases where the electrodes 422 of all the discharge modules 42 are sparsely distributed within the liquid 15 under treatment.

The operation of the system 50 starts from charging the general capacitor bank 412 by the voltage supply device 411. The general switch (413 in FIG. 5), the working switches 421, and the additional working switches 521 can all be maintained in the switched off position. In operation, the general capacitor bank 412 is permanently charged since it is permanently connected to the voltage supply device 411. The general capacitor bank 412 can be partially discharged by closing (switching on) the general switch (413 in FIG. 5), to supply a high voltage to the working capacitor banks 414. The decrease of voltage across the general capacitor bank 412 owing to this discharge is relatively small, due to the condition $C_g >> C_w$. Thus, the drop of the voltage across the general capacitor bank 412 can be easily compensated by charging the general capacitor bank from the voltage supply device 411. As soon as the charging process of the working capacitor banks 414 is complete, the general switch (413 in FIG. 5) should be switched off in order to disconnect the general capacitor bank 412 from the working capacitor banks 414, and thereby to avoid a further discharge of the general capacitor bank 412 together with the working capacitor banks 414.

Closing one or more working switches 421 (but maintaining all the additional working switches 521 in the switched off position) results in the electric discharge of the corresponding working capacitor banks 414 and generation of a transient electric current pulse between the potential electrodes 422 and the grounded electrode 423 that is associated with the body of the vessel 16 through the liquid 15 under treatment. In order to maintain the electric current discharge within the liquid, one or more additional working switches 521 are closed (switched on), thereby resulting in the electric discharge of the corresponding additional working capacitor banks 514 and maintaining transient electric current between the corresponding potential electrodes 422 and the grounded electrode 423.

It should be noted that when a certain type of working switches is used, e.g., thyratrons, then one of the switch electrodes have to be permanently grounded.

Figure 6A:
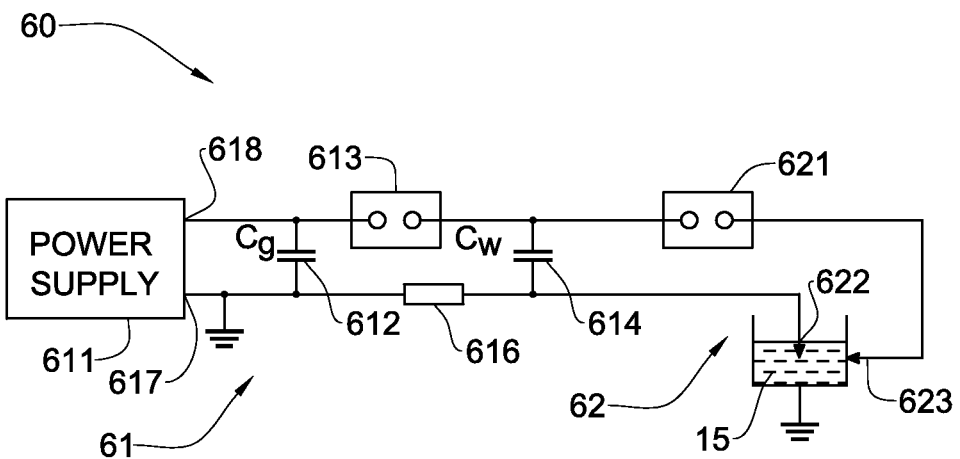
FIGS. 6A and 6B are electric schemes of a system for producing a strong electric pulse, according to yet two further embodiments of the present invention.
Figure 6B:
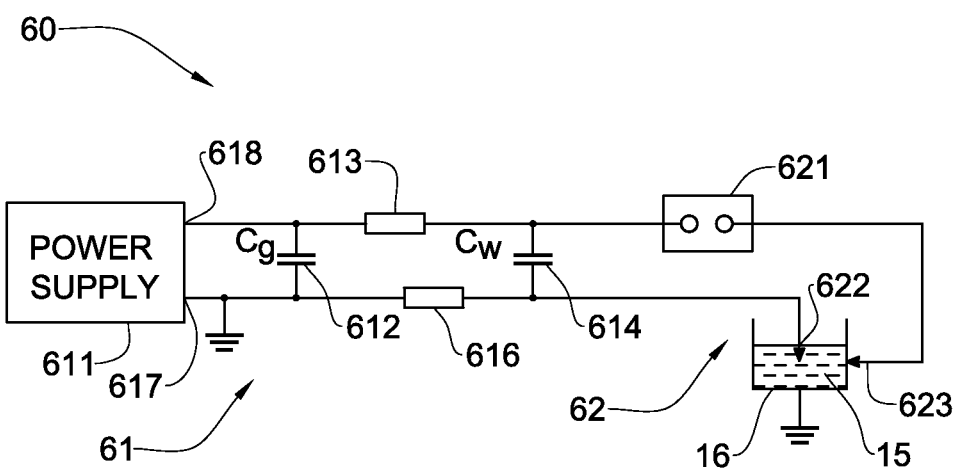

Referring to FIGS. 6A and 6B, an electric scheme of a system 60 for treatment of a contaminated liquid is shown, according to a further two embodiments of the invention. The system 60 includes a charge circuit 61 and a discharge module 62 electrically coupled to the charge circuit 61. The charge circuit 61 includes a high-voltage supply device 611 connected to a general capacitor bank 612 and a working capacitor bank 614 coupled to the general capacitor bank 612 at one terminal through a first general limiting member 613 and at another terminal through a second general limiting member 616 that connects the ground terminals of the general capacitor bank 612 and the working capacitor bank 614.

According to the embodiment shown in FIG. 6A, the first general limiting member 613 is a switch device. Thus, in this embodiment the terms "first general limiting member" and "general switch device" are interchangeable. In turn, the second general limiting member 616 is a resistor device. Accordingly, in this embodiment the terms "second general limiting member" and "general resistive element" are interchangeable.

As shown in FIG. 6A, the general switch device 613 is arranged in the potential power electric line; whereas the general resistive element 616 is arranged in the grounded electric line. However, when desired, the general switch device may be arranged in the grounded electric line; whereas the general resistive element may be arranged in the potential power electric line.

According to the embodiment shown in FIG. 6B, the first general limiting member 613 as well as the second general limiting member 616 are both resistor devices. In this case, the working capacitor bank 614 is coupled to the general capacitor bank 612 through a first resister device (herein referred to as a first general resistive element 613) arranged in the potential electric line and through a second resister device (herein referred to as a second general resistive element 616) arranged in the grounded electric line. According to this embodiment, the general resistive element 616 connects the ground terminals of the general capacitor bank 612 and the working capacitor bank 614.

The discharge module 62 of the system 60 includes a working switch 621 that is arranged in series with the working capacitor bank 613 and electrodes 622 and 623 separated by a gap within the liquid 15 and arranged in series with the working switch 621 for providing an electric discharge within the liquid 15.

As shown in FIGS. 6A and 6B, the electrode 622 is connected to the second general limiting member (resistive element) 616 designed for protecting the high-voltage supply device 611 from overload. Likewise, the second general limiting member 616 serves to limit the discharge current between the general capacitor bank 612 and the working capacitor bank 614 for avoiding a discharge of the general capacitor bank 612 together with the working capacitor bank 614. Moreover, in operation, the potential electrode 618 of the high-voltage supply device 611 can be coupled to its grounded electrode 617 through the general resistive element 616. In this case, charging of the working capacitor bank 614 is also provided through general resistive element 616. Thus, the charging current of the working capacitor bank 614 can also be limited. The electrical resistance of the second general limiting member 616 can, for example, be in the range of 10 kOhm-50 kOhm.

When desired, the electrode 622 can be terminated by a plurality of working ends immersed into the liquid 15 and distributed within a desired volume of the liquid, although, as shown in FIGS. 6A and 6B, merely one working end can also be utilized. The working ends are connected via cables to the common potential electrode 622. The second electrode 623 is coupled to or associated with a grounded conductive body of the treatment vessel 16 holding the liquid 15.

For safety reasons, one of the terminals (617 in FIGS. 6A and 6B) of the high-voltage supply device 611 (e.g., the "negative" terminal) is permanently grounded. Moreover, the conductive body of the treatment vessel 16 is also permanently grounded.

The operation of the system 60 starts from charging the general capacitor bank 612 by the voltage supply device 611. In operation, the general capacitor bank 612 is permanently charged since it is permanently connected to the voltage supply device 611. The general capacitor bank 612 supplies a high voltage to the working capacitor bank 614.

According to the embodiment shown in FIG. 6A, the general capacitor bank 612 can be partially discharged by closing (switching on) the switch 613, and through the second general resistive element 616, to supply a high voltage to the working capacitor bank 614. According to the embodiment shown in FIG. 6B, the general capacitor bank 612 permanently supplies a high voltage to the working capacitor bank 614 through the first general resistive element 613 and second general resistive element 616 connected to the voltage supply device 611.

The loss of voltage across the general capacitor bank 612 owing to this discharge can be estimated by $(C_g - C_w)/C_g$. Due to the condition $C_g \gg C_w$, this loss is relatively small, i.e., $(C_g - C_w)/C_g \ll 1$. Thus, the drop of the voltage across the general capacitor bank 612 can be easily compensated by charging the general capacitor bank 612 from the voltage supply device 611.

According to the embodiment shown in FIG. 6A, the working capacitor bank 614 can be discharged by opening (switching off) the general switch 613 and then closing (switching on) the working switch 621 to discharge the working capacitor bank 614 and generate a transient electric current pulse between the electrodes 622 and 623 through the liquid under treatment.

According to the embodiment shown in FIG. 6A, the working capacitor bank 614 can be discharged by closing (switching on) the working switch 621 to discharge the working capacitor bank 614 and generate a transient electric current pulse between the electrodes 622 and 623 through the liquid under treatment. The first general limiting resister 613 should limit the current between the general capacitor bank 612 and the working capacitor bank 614, thereby avoiding a discharge of the general capacitor bank 612 together with the working capacitor bank 614 during operation.

As such, those skilled in the art to which the present invention pertains, can appreciate that while the present invention has been described in terms of preferred embodiments, the conception, upon which this disclosure is based, may readily be utilized as a basis for the designing of other structures systems and processes for carrying out the several purposes of the present invention.

It should be understood that when desired each of the described above embodiments of the system and method for treatment of a contaminated liquid can be utilized in a multi-stage treatment process. For example, the further treatment of the liquid can include passing the liquid through a filter unit to obtain the purified fluid downstream of the filter unit.

It is to be understood that the phraseology and terminology employed herein are for the purpose of description and should not be regarded as limiting.

Finally, it should be noted that the word "comprising" as used throughout the appended claims is to be interpreted to mean "including but not limited to".

It is important, therefore, that the scope of the invention is not construed as being limited by the illustrative embodiments set forth herein. Other variations are possible within the scope of the present invention as defined in the appended claims. Other combinations and sub-combinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present description.

The invention claimed is:

1. A system for treatment of a contaminated liquid, comprising:
    a high voltage supply device comprising a grounded terminal and a potential terminal;
    a general capacitor bank coupled to the high voltage supply device;
    a general switch coupled to said high voltage supply device and to the general capacitor bank;
    an additional general switch coupled to the general capacitor bank;
    at least one working capacitor bank coupled to the general capacitor bank through the general switch;
    at least one additional working capacitor bank having a grounded terminal and a potential terminal, said potential terminal being coupled to the general capacitor bank through said additional general switch;
    at least one working switch arranged in series with the corresponding working capacitor bank;
    at least one potential electrode immersed in said contaminated liquid and coupled to said at least one working capacitor bank through said at least one working switch; and
    at least one grounded electrode, and a gap defined within the contaminated liquid between said at least one grounded electrode and said at least one potential electrode and arranged in series with the working switch for providing an electric discharge through a portion of the contaminated liquid within the gap; and
    at least one additional working switch arranged in series with the potential terminal of the corresponding additional working capacitor bank and arranged between the potential terminal of the corresponding additional working capacitor bank and the corresponding electrode that is immersed into the liquid under treatment.

2. The system according to claim 1, wherein an electrical capacity of the general capacitor bank is greater than the electrical capacity of said at least one working capacitor bank.

3. The system according to claim 1, comprising at least two said working capacitor banks; and wherein the neighboring working capacitor banks are separated from each other by a working current resistive element.

4. The system according to claim 3, wherein said working current resistive element is arranged in a potential electric line.

5. The system according to claim 3, wherein said working current resistive element is arranged in a grounded electric line.

6. The system according to claim 1, wherein said at least one general switch is arranged in a potential electric line and coupled to the potential terminal of the high-voltage supply device.

7. The system according to claim 1, wherein said general switch is arranged in a grounded electric line and coupled to the grounded terminal of the high-voltage supply device.

8. The system according to claim 1, wherein grounded conductive body of a treatment vessel acts as said at least one grounded electrode.

9. The system according to claim 1, wherein the general capacitor bank and said at least one working capacitor bank are connected together by a common grounded bus coupled to the grounded terminal of the high-voltage supply device.

10. The system according to claim 1, further including at least one general limiting resistor arranged in a grounded electric line.

11. The system according to claim 1, wherein said general switch and said at least one working switch are high current switches.

12. The system according to claim 1, wherein said general switch and said at least one working switch are three electrode spark-gap switches including two switching electrodes forming the switching paths and a trigger electrode configured for providing passage of high current between the two switching electrodes.

13. The system according to claim 1, wherein said at least one working switch is a semiconductor high current switch.

14. The system according to claim 1, comprising at least two said additional working capacitor banks, wherein said at least two additional working capacitor banks are separated from each other by an additional current resistive element arranged in a potential power line.

15. The system according to claim 14, wherein an additional electrical capacity ($C_{add}$) of the additional working capacitor bank is greater than an electrical capacitance ($C_w$) of the working capacitor bank, but it is less than a capacitance ($C_g$) of the general capacitor bank.

16. A method for treatment of a contaminated liquid, comprising:
   providing a system for treatment of a contaminated liquid of claim 1;
   placing said general switch, said additional general switch, said at least one working switch, and said at least one additional working switch in the switched off position;
   charging the general capacitor bank by connecting to the voltage supply device;
   switching on said at least one general switch and said additional general switch to supply a high voltage to said at least one working capacitor bank and said at least one additional working capacitor bank for charging thereof by partially discharging the general capacitor bank;
   switching on said at least one working switch and said at least one additional working switch, thereby discharging said at least one working capacitor bank and said at least one additional working capacitor bank and generating a transient electric current pulse between said at least one potential electrode and said at least one grounded electrode.

17. The method according to claim 16, further comprising the step of switching off said at least one general switch to break the connection between the general capacitor bank and said at least one working capacitor bank before the step of switching on said at least one working switch, and switching off said additional general switch to break the connection between the general capacitor bank and said at least one additional working capacitor bank before the step of switching on said at least one additional working switch.

18. The method of claim 16, wherein said system further comprises a plurality of working capacitor banks and a plurality of additional working capacitor banks coupled to a plurality of potential electrodes immersed in said contaminated liquid through a plurality of corresponding working switches and additional working switches, and wherein the method further comprises the step of simultaneous switching on said plurality of the working switches and said plurality of additional working switches to provide a simultaneous electric discharge of said plurality of working capacitor banks and said plurality of additional working capacitor banks
   through the contaminated liquid between said plurality of potential electrodes and said at least one grounded electrode.

19. The method according to claim 16, wherein said system comprises a plurality of working capacitor banks and a plurality of additional working capacitor banks coupled to a plurality of potential electrodes immersed in said contaminated liquid through a plurality of corresponding working switches and additional working switches, and wherein the method further comprises the step of switching on at least one working switch and said at least one additional working switch in accordance with a predetermined algorithm.

20. The method of claim 16, further comprising:
   switching on said additional general switch to supply a high voltage to said at least one additional working capacitor bank for charging thereof by partially discharging the general capacitor bank;
   switching on said at least one additional working switch to provide discharge of said at least one additional working capacitor bank and thereby to maintain transient electric current between the corresponding potential electrode and the grounded electrode.

* * * * *